(12) United States Patent
Jung et al.

(10) Patent No.: US 6,770,720 B2
(45) Date of Patent: Aug. 3, 2004

(54) ORGANIC POLYMER FOR ORGANIC ANTI-REFLECTIVE COATING LAYER AND PREPARATION THEREOF

(75) Inventors: Jae-chang Jung, Icheon-shi (KR);
Keun-kyu Kong, Kwangju-shi (KR);
Min-ho Jung, Icheon-shi (KR);
Sung-eun Hong, Seongnam-shi (KR);
Ki-ho Baik, Icheon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 10/313,480

(22) Filed: Dec. 4, 2002

(65) Prior Publication Data

US 2003/0100695 A1 May 29, 2003

Related U.S. Application Data

(63) Continuation of application No. 09/657,085, filed on Sep. 7, 2000, now abandoned.

(30) Foreign Application Priority Data

Sep. 7, 1999 (KR) ............................................ 99-37877

(51) Int. Cl.[7] ............................................. C08F 216/34
(52) U.S. Cl. ...................... 526/315; 526/266; 526/319; 526/329.7; 526/320; 526/328; 526/328.5; 526/329.2; 526/329.6; 525/154; 525/328.7; 430/270.1; 430/325
(58) Field of Search ............................... 430/270.1, 325; 526/266, 271, 319, 329.7, 320, 328, 328.5, 329.2, 329.6

(56) References Cited

U.S. PATENT DOCUMENTS

| | | | | |
|---|---|---|---|---|
| 4,046,577 A | * | 9/1977 | Muzyczko et al. ...... | 430/280.1 |
| 4,304,703 A | * | 12/1981 | Das ............................ | 524/458 |
| 4,424,270 A | | 1/1984 | Erdmann et al. | |
| 4,485,193 A | * | 11/1984 | Rubens et al. ................ | 521/58 |
| 4,604,426 A | | 8/1986 | Rubens | |
| 4,822,718 A | | 4/1989 | Latham et al. | |
| 5,492,959 A | * | 2/1996 | Clark ......................... | 524/457 |
| 5,674,648 A | | 10/1997 | Brewer et al. | |
| 5,916,972 A | * | 6/1999 | Eck et al. .................... | 525/223 |
| 5,977,201 A | * | 11/1999 | Jahns et al. .................. | 522/111 |
| 6,294,607 B1 | * | 9/2001 | Guo et al. ................... | 524/507 |
| 6,379,769 B1 | * | 4/2002 | Kleinke et al. ............... | 428/68 |

FOREIGN PATENT DOCUMENTS

| | | |
|---|---|---|
| EP | 0 277 038 A2 | 8/1988 |
| EP | 0 277 038 A3 | 8/1988 |
| JP | 60036504 * | 8/1983 |
| JP | 10101999 A | 4/1998 |
| JP | 11350254 A | 12/1999 |
| WO | WO 00/01752 | 1/2000 |

* cited by examiner

Primary Examiner—Tatyana Zalukaeva
(74) Attorney, Agent, or Firm—Townsend and Townsend and Crew LLP

(57) ABSTRACT

Disclosed is an organic anti-reflective film composition suitable for use in submicrolithography, comprising a compound of Formula 13 and a compound of Formula 14. The organic anti-reflective film effectively absorbs the light penetrating through the photoresist film coated on top of the anti-reflective film, thereby greatly reducing the standing wave effect. Use of organic anti-reflective films of the present invention allows patterns to be formed in a well-defined, ultrafine configuration, providing a great contribution to the high integration of semiconductor devices.

Formula 13

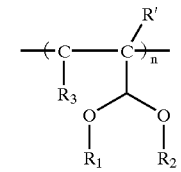

Formula 14

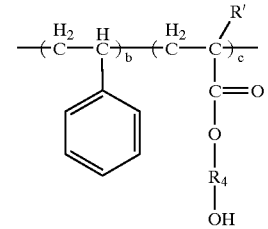

wherein b, c, R', R", $R_1$, $R_2$, $R_3$, and $R_4$ are those defined herein.

21 Claims, 1 Drawing Sheet

140nm

ORGANIC POLYMER FOR ORGANIC ANTI-REFLECTIVE COATING LAYER AND PREPARATION THEREOF

BACKGROUND OF THE INVENTION

1. Field of the Invention

The present invention relates to an organic anti-reflective film composition suitable for use in submicrolithography. More particularly, the present invention relates to an organic anti-reflective film composition which contains a chromophore with high absorbance at the wavelengths useful for submicrolithography, thereby allowing the stable formation of ultrafine patterns suitable for use in the high integration of semiconductor devices. Also, the present invention provides a method for forming ultrafine patterns using such an organic anti-reflective film composition.

2. Description of the Prior Art

In a submicrolithographic process, there inevitably occurs standing waves and reflective notching of the waves due to the optical properties of lower layers coated on the wafer, due to changes in the thickness of the photoresist film applied thereon, and due to the CD (critical dimension) alteration caused by diffracted and reflected light from the lower layers. As a solution to these problems, it has been proposed to introduce into the lower part of the photoresist film an anti-reflective layer made of a material which is highly absorptive of the light whose wavelength ranges are used in the submicrolithography process.

In the absence of such an anti-reflective layer, the light, when being irradiated on the photoresist film from a UV light source, penetrates into the photoresist film and is reflected back or scattered from its lower layer or the surface of the semiconductor chip. The anti-reflective layer can be introduced to prevent the reflection or scattering of light, thereby having a direct influence on the submicrolithography process of photoresist films.

The anti-reflective film can be inorganic or organic material and is generally divided into two types depending on its mechanism: an absorptive anti-reflective film or an interferential anti-reflective film.

For the microlithography using i-line (365 nm) as a light source, inorganic anti-reflective films are usually used. Of these, absorptive anti-reflective layers are largely made from TiN or amorphous carbon (amorphous-C) while interferential anti-reflective layers are mostly based on SiON. These SiON-based anti-reflective films are also used for the formation of ultrafine patterns for which KrF (248 nm) is utilized as a light source.

As for an ArF light source, which is much shorter in wavelength than the above-mentioned two light sources, a suitable anti-reflective films pertinent to submicrolithography has not yet been developed. Currently, there is an extensive research directed to the development of organic anti-reflective materials which are suitable for use in an ArF light submicrolithography process.

Following are desired characteristics for organic anti-reflective materials:

First, peeling of the photoresist layer due to dissolution of the organic anti-reflective material in a solvent should not take place when conducting a lithographic process. In this regard, organic anti-reflective materials should be designed so that their cured films have a crosslinked structure without producing by-products.

Second, there should be no migration of chemical materials, such as acids or amines, to and from the anti-reflective layers. If acids migrate from the anti-reflective layer into an unexposed area of a positive photoresist film, the photosensitive patterns are undercut while the egress of bases, such as amines, causes a footing phenomena.

Third, faster etch rates should be realized in the anti-reflective layer than in the upper photosensitive film, allowing an etching process to be conducted smoothly with the photosensitive film serving as a mask.

Finally, organic anti-reflective layers should be as thin as possible while having a superior ability to prevent light reflection.

SUMMARY OF THE INVENTION

The present invention provides an anti-reflective resin which meets the above requirements. In particular, it has been found that anti-reflective resins of the present invention are suitable for use in ultrafine pattern formation using ArF light source.

It is an object of the present invention to overcome the problems encountered in the prior art and to provide a novel organic compound which can be used as an anti-reflective material for submicrolithography using an ArF laser (193 nm).

It is another object of the present invention to provide a method for preparing an organic compound which prevents the diffusion and reflection caused by light exposure in submicrolithography.

It is a further object of the present invention to provide an anti-reflective composition containing such an organic diffusion/reflection-preventive compound and a preparation method therefor.

It is a still further object of the present invention to provide a method for forming on a semiconductor device a pattern with a greatly reduced standing wave effect during a submicrolithography process using an ArF laser.

It is yet another object of the present invention to provide a semiconductor device on which a pattern is formed using such an anti-reflective composition in a submicrolithography process.

DETAILED DESCRIPTION OF THE INVENTION

Figure 1:
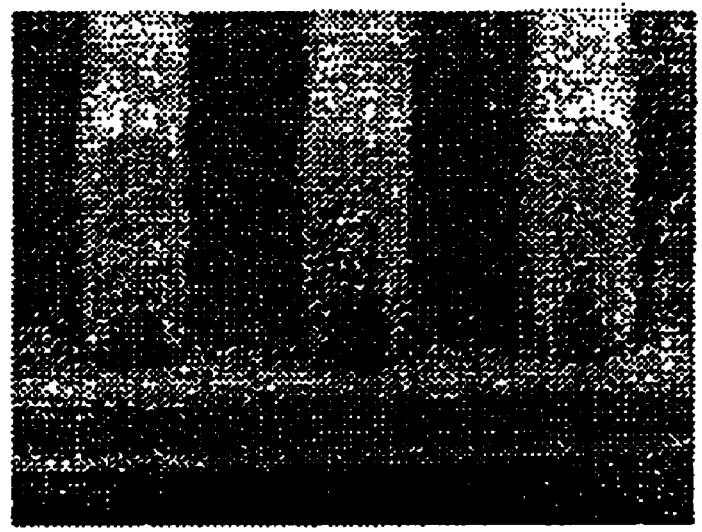
FIG. 1 is a photograph showing well-defined perpendicular patterns formed on an organic anti-reflective film composition of the present invention.

One embodiment of the present invention provides Compounds of Formulas 13 and 14:

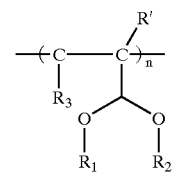

Formula 13

Formula 14

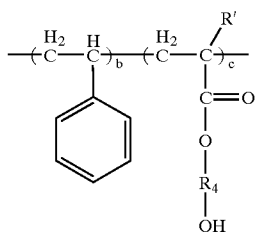

wherein
b and c represent mole numbers, provided that the ratio of b:c ranges from 0.1–1.0:0.1–1.0;
R' and R" are independently hydrogen or alkyl (preferably methyl);
$R_1$, $R_2$ and $R_4$, which are the same or different, each represents a substituted or unsubstituted, linear or branched alkyl group containing 1–5 carbon atoms; and
$R_3$ is a hydrogen atom or a substituted or unsubstituted, linear or branched alkyl group containing 1–5 carbon atoms.

Another embodiment of the present invention provides a method for preparing Compound of Formula 14 comprising the steps of adding the appropriate monomers constituting Compounds of Formula 14 in an organic solvent and polymerizing the monomers in the presence of a polymerization initiator under an inert atmosphere. Preferably, the polymerization is carried out under a nitrogen or an argon atmosphere. In a preferred version of this embodiment, monomers constituting Compound of Formula 14 are Compounds of Formulas 3 and 4 or 5:

Formula 3

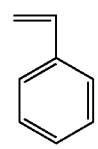

Formula 4

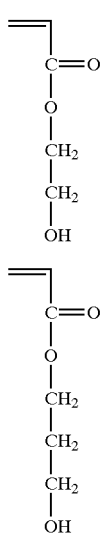

Formula 5

Preferably, the solvent for polymerization reaction is selected from the group consisting of tetrahydrofuran, toluene, benzene, methylethyl ketone, dioxane, and mixtures thereof.

Preferabaly, the polymerization initiator is selected from the group consisting of 2,2-azobisisobutyronitrile (AIBN), benzoylperoxide, acetylperoxide, laurylperoxide, t-butyloxide and mixtures thereof.

Another embodiment of the present invention provides an organic anti-reflective film composition comprising a Compound of Formula 13, a Compound of Formula 14, a heat acid-generator, and an organic solvent.

In one particular embodiment of the present invention, the molecular weight of Compounds of Formula 13 is in the range of from about 4,000 to about 12,000. Preferably, the molecular weight of Compounds of Formula 14 is in the range of from about 4,000 to about 15,000.

Preferably, the organic solvent in the anti-reflective film composition is selected from the group consisting of methyl 3-methoxypropionate, ethyl 3-ethoxypropionate, propyleneglycol methyletheracetate, 2-heptanone, tetrahydrofuran, and mixtures thereof. Preferably, the organic solvent is used in an amount of from about 2,000 to about 4,000% by weight based on the weight of Compounds of Formula 13 or 14.

In one aspect of the present invention, the heat acid-generator is preferably used in an amount from about 0.1 to about 10% by weight of the total weight of Compounds of Formulas 11 and 12. Preferably, the heat acid-generator is selected from the group consisting of Compounds of Formulas 8 to 12 and mixtures thereof:

Formula 8

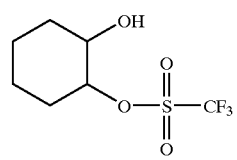

Formula 9

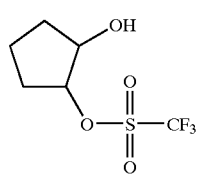

Formula 10

Formula 11

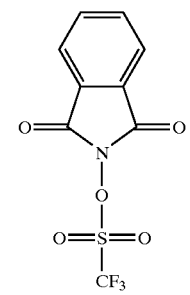

Formula 12

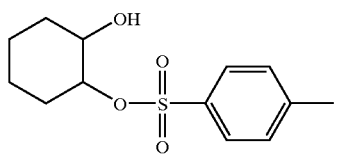

Another embodiment of the present invention provides a method for forming an anti-reflective film pattern using the above described organic anti-reflective film composition comprising the steps of:
(a) coating the above described organic anti-reflective film composition onto a layer to be etched;
(b) baking the organic anti-reflective film composition-coated layer;

(c) creating a photoresist pattern by coating a photoresist film on the organic anti-reflective film;

(d) exposing the photoresist film to a light source;

(e) developing the light-exposed photoresist film; and (f) etching sequentially the organic anti-reflective film and the layer to be etched, with the photoresist pattern serving as an etch mask.

In one embodiment, the baking step is preferably conducted at 100–250° C. for 1–5 min.

The method for forming an anti-reflective film pattern can further comprise a baking step prior to and/or subsequent to the exposing step. In this case, the baking step is preferably conducted at 70–200° C.

Preferably, the light source is selected from the group consisting of deep ultra violet beams including ArF, KrF and EUV, an electron beam, an X-ray, an ion beam, and combinations thereof. Preferably, the exposing step is carried out with the light energy of 0.1–20 mJ/cm$^2$.

In accordance with still another embodiment of the present invention, there is provided a semiconductor device which is fabricated using the anti-reflective film pattern prepared above.

A better understanding of the present invention may be obtained in light of the following examples which are set forth to illustrate, but are not to be construed to limit, the present invention.

EXAMPLE I

Synthesis of Compound of Chemical Formula 6

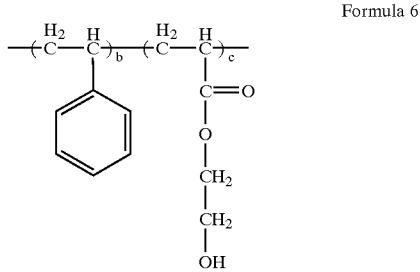

Formula 6

In a 250 ml round-bottom flask, 0.1 mole (10.4 g) of monomer of Formula 3 and 0.1 mole (11.6 g) of monomer of Formula 4 were added to a solvent mixture of 66 g of isobutylmethyl ketone and 66 g of tetrahydrofuran. The resulting solution was stirred at 65° C. for six hours in the presence of 0.44 g of 2,2-azobisisobutyronitrile (AIBN) under an inert atmosphere (e.g., under a nitrogen or an argon atmosphere). A solid was precipitated using ethyl ether and dried to afford the desired compound: 9 g; Yield 40%.

EXAMPLE 2

Synthesis of Compound of Chemical Formula 7

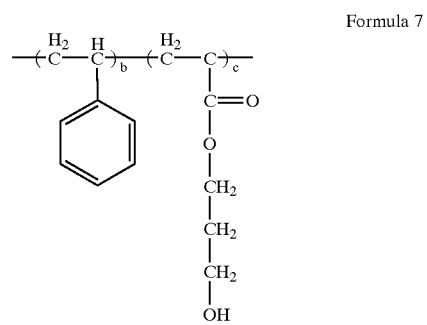

Formula 7

In a 250 ml round-bottom flask, 0.1 mole (10.4 g) of monomer of Formula 3 and 0.1 mole (13 g) of monomer of Formula 5 were added to a solvent mixture of 66 g of isobutylmethyl ketone and 66 g of tetrahydrofuran. The resulting solution was stirred at 65° C. for six hours in the presence of 0.44 g of 2,2-azobisisobutyronitrile (AIBN) under an inert atmosphere. A solid was precipitated using ethyl ether and dried to afford the desired compound.

EXAMPLE 3

Preparation of Anti-Reflective Film Composition from Combination of Compounds of Chemical Formulas 1 and 6 and Formation of Pattern Therefrom To 1,050 g of propyleneglycol methylether acetate was added 14 g of Compound of Formula 1, 21 g of Compound of Formula 6, and 0.35 g of a heat acid-generator of Formula 8. The resulting solution was filtered through a 0.2 μm fine filter to give an organic anti-reflective film composition. This solution was spin-coated onto a silicon wafer and then cured by baking at 205° C. for 120 sec.

On the cured anti-reflective film was coated photosensitive agent DHA1001 and baked at 110° C. for 90 sec. Afterwards, the multi-coated wafer was exposed to light using an ArF light source with the aid of an ArF microstepper (manufactured by ISI) followed by baking at 110° C. for 90 sec. The wafer was developed using an aqueous 2.38 wt % methylammonium hydroxide solution and observed to have well-defined perpendicular patterns as shown in FIG. 1.

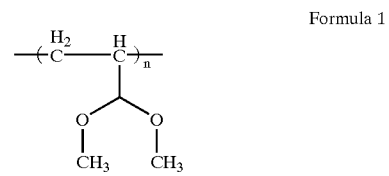

Formula 1

EXAMPLE 4

Preparation of Anti-Reflective Film Composition from Combination of Compounds of Chemical Formulas 1 and 7 and Formation of Pattern Therefrom To 1,050 g of propyleneglycol methylether acetate was added 14.0 g of Compound of Formula 1, 21.0 g of Compound of Formula 7, and 0.35 g of a heat acid-generator of Formula 8. The resulting solution was filtered through a 0.2 μm fine filter to give an organic anti-reflective film composition. This solution was spin-coated onto a silicon wafer and then cured by baking at 205° C. for 120 sec.

On the cured anti-reflective film was coated photosensitive agent DHA1001 and baked at 110° C. for 90 sec. Afterwards, the multi-coated wafer was exposed to light using an ArF light source with the aid of an ArF microstepper, followed by baking at 110° C. for 90 sec. The wafer was developed using an aqueous 2.38 wt % methylammonium hydroxide solution and observed to have well-defined perpendicular patterns.

EXAMPLE 5

Preparation of Anti-Reflective Film Composition from Combination of Compounds of Chemical Formulas 2 and 6 and Formation of Pattern Therefrom To 1,050 g of propyleneglycol methylether acetate was added 14.0 g of Compound of Formula 2, 21.0 g of Compound of Formula 6, and 0.35 g of a heat acid-generator of the chemical formula 8. The resulting solution was filtered through a 0.2 μm fine filter to give an organic anti-reflective film composition. This solution was spin-coated onto a silicon wafer and then cured by baking at 205° C. for 120 sec.

On the cured anti-reflective film was coated photosensitive agent DHA1001 and baked at 110° C. for 90 sec. Afterwards, the multi-coated wafer was exposed to light using an ArF light source with the aid of an ArF microstepper, followed by baking at 110° C. for 90 sec. The wafer was developed using an aqueous 2.38 wt % methylammonium hydroxide solution and observed to have well-defined perpendicular patterns Formula 2

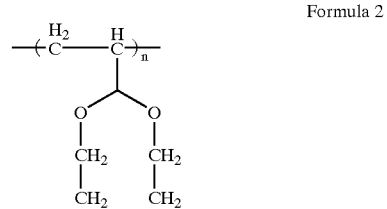

EXAMPLE 6

Preparation of Anti-Reflective Film Composition from Combination of Compounds of Chemical Formulas 2 and 7 and Formation of Pattern Therefrom To 1,050 g of propyleneglycol methylether acetate was added 14.0 g of Compound of Formula 2, 21.0 g of Compound of Formula 7, and 0.35 g of heat acid-generator of Formula 8. The resulting solution was filtered through a 0.2 μM fine filter to give an organic anti-reflective film composition. This solution was spin-coated onto a silicon wafer and then cured by baking at 205° C. for 120 sec.

On the cured anti-reflective film was coated photosensitive agent DHA1001 and baked at 110° C. for 90 sec. Afterwards, the multi-coated wafer was exposed to light using an ArF light source with the aid of an ArF microstepper, followed by baking at 110° C. for 90 sec. The wafer was developed using an aqueous 2.38 wt % methylammonium hydroxide solution and observed to have well-defined perpendicular patterns.

Anti-reflective compositions of the present invention, which comprise a crosslinking agent of Formula 13 and an alcohol group-containing organic anti-reflective substrate of Formula 14, are not affected by a photoresist solution which overlays the anti-reflective film. That is, anti-reflective compositions of the present invention are not dissolved in a photoresist solution. Moreover, anti-reflective compositions of the present invention absorb the light penetrating through the photoresist film, thereby greatly reducing the standing wave effect. Thus, organic anti-reflective films of the present invention allow the patterns to be formed in a well-defined, ultrafine configuration, providing great contribution to a high integration of semiconductor devices.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An organic anti-reflective film composition, comprising a compound of Formula 13 and a compound of Formula 14:

Formula 13

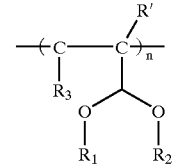

Formula 14

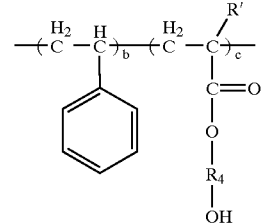

wherein

R' is hydrogen or alkyl;

$R_1$ and $R_2$, which are the same or different, each represents a substituted or unsubstituted, linear or branched alkyl group containing 1–5 carbon atoms;

$R_3$ is a hydrogen atom or a substituted or unsubstituted, linear or branched alkyl group containing 1–5 carbon atoms;

b and c represent mole numbers, respectively, provided that the ratio of b:c ranges from 0.1–1.0:0.1–1.0;

R" is hydrogen or alkyl; and $R_4$ represents a substituted or unsubstituted, linear or branched alkyl group containing 1–5 carbon atoms.

2. The organic anti-reflective film composition according to claim 1, wherein said compound of Formula 14 is a polymer of the formula:

Formula 6

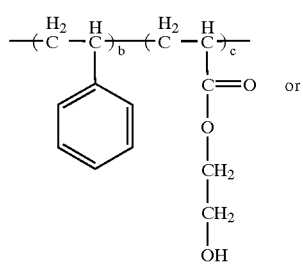

or

Formula 7

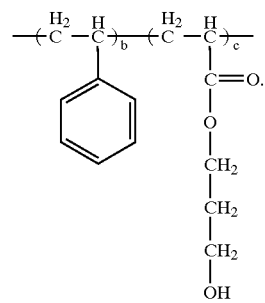

3. The organic anti-reflective film composition as set forth in claim 1, further comprising an organic solvent and a heat acid-generator.

4. The organic anti-reflective film composition as set forth in claim 3, wherein said organic solvent is selected from the group consisting of methyl 3-methoxypropionate, ethyl 3-ethoxypropionate, propyleneglycol methyletheracetate, 2-heptanone, tetrahydrofuran and mixtures thereof.

5. The organic anti-reflective film composition as set forth in claim 3, wherein said organic solvent is used in an amount of from about 2,000 to about 4,000% by weight based on the weight of said compound of Formula 13 or 14.

6. The organic anti-reflective film composition as set forth in claim 3, wherein said heat acid-generator is selected from the group consisting of compounds of Formulas 8 to 12 and mixtures thereof:

Formula 8

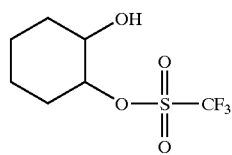

Formula 9

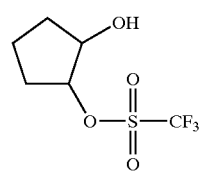

Formula 10

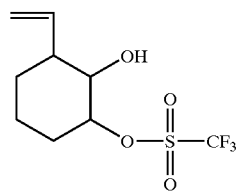

-continued

Formula 11

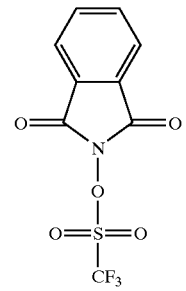

Formula 12

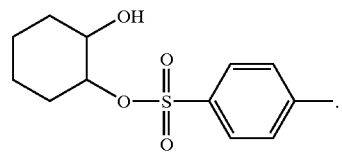

7. The organic anti-reflective film composition as set forth in claim 3, wherein said heat acid generator is used at an amount of from about 0.1 to about 10% by weight based on the total weight of said compounds of Formulas 13 and 14.

8. A method for forming an anti-reflective film pattern using the organic anti-reflective film composition as in claim 3, comprising the steps of:

applying the organic anti-reflective film composition onto a layer to be etched;

baking the organic anti-reflective film composition-applied layer;

creating a photoresist pattern by coating a photoresist film on the organic anti-reflective film;

exposing the photoresist film to light using a light source;

developing the light-exposed photoresist film; and etching sequentially the organic anti-reflective film and further the layer to be etched, with the photoresist pattern serving as an etch mask.

9. The method as set forth in claim 8, wherein said baking step is conducted at 100–250° C. for 1–5 min.

10. The method as set forth in claim 8, further comprising another baking step prior to and/or subsequent to the exposing step.

11. The method as set forth in claim 10, wherein said another baking step is preferably conducted at 70–200° C.

12. The method as set forth in claim 8, wherein said light source is selected from the group consisting of deep ultra violet beams including ArF, KrF and EUV, an electron beam, an X-ray, an ion beam, and combinations thereof.

13. The method as set forth in claim 8, wherein said exposing step is carried out using a light energy of from about 0.1 to about 20 mJ/cm$^2$.

14. A semiconductor device produced using the method of claim 8.

15. The organic anti-reflective film composition of claim 1, wherein R' is hydrogen or methyl.

16. The organic anti-reflective film composition of claim 1, wherein $R^1$ and $R^2$ are methyl or ethyl.

17. A method for reducing or preventing reflection or diffusion of light during a submicrolithographic process, said method comprising coating an antireflective composition onto a substrate prior to coating the substrate with a photoresist composition, wherein the antireflective composition comprises a compound of Formula 13 and a compound of Formula 14:

Formula 13

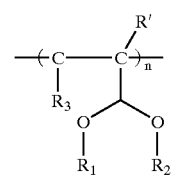

Formula 14

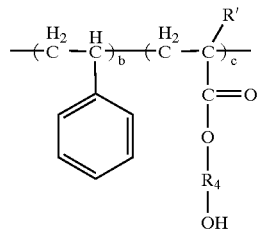

wherein

R' is hydrogen or alkyl;

$R_1$ and $R_2$, which are the same or different, each represents a substituted or unsubstituted, linear or branched alkyl group containing 1–5 carbon atoms;

$R_3$ is a hydrogen atom or a substituted or unsubstituted, linear or branched alkyl group containing 1–5 carbon atoms;

b and c represent mole numbers, respectively, provided that the ratio of b:c ranges from 0.1–1.0:0.1–1.0;

R" is hydrogen or alkyl; and $R_4$ represents a substituted or unsubstituted, linear or branched alkyl group containing 1–5 carbon atoms.

18. The method of claim 17, wherein the compound of Formula 14 is a polymer list of the formula:

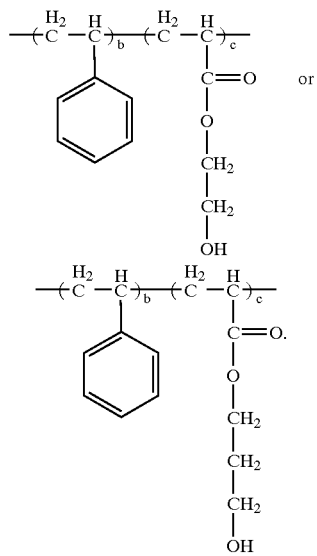

19. The method of claim 17, wherein R' is hydrogen or methyl.

20. The method of claim 17, wherein $R^1$ and $R^2$ are methyl or ethyl.

21. A method for reducing or preventing standing wave effect during a submicrolithography process, said method comprising coating an antireflective composition onto a substrate prior to coating the substrate with a photoresist composition, wherein the antireflective composition comprises a compound of Formula 13 and a compound of Formula 14:

Formula 13

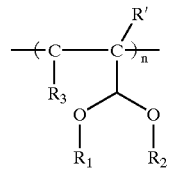

Formula 14

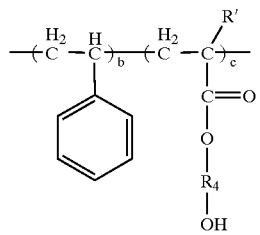

wherein

R' is hydrogen or alkyl;

$R_1$ and $R_2$, which are the same or different, each represents a substituted or unsubstituted, linear or branched alkyl group containing 1–5 carbon atoms;

$R_3$ is a hydrogen atom or a substituted or unsubstituted, linear or branched alkyl group containing 1–5 carbon atoms;

b and c represent mole numbers, respectively, provided that the ratio of b:c ranges from 0.1–1.0:0.1–1.0;

R" is hydrogen or alkyl; and $R_4$ represents a substituted or unsubstituted, linear or branched alkyl group containing 1–5 carbon atoms.

* * * * *

UNITED STATES PATENT AND TRADEMARK OFFICE
CERTIFICATE OF CORRECTION

PATENT NO. : 6,770,720 B2  
DATED : August 3, 2004  
INVENTOR(S) : Jae-chang Jung et al.

Page 1 of 2

It is certified that error appears in the above-identified patent and that said Letters Patent is hereby corrected as shown below:

Title page,  
Item [57], ABSTRACT,  
Formula 14, the formula reading

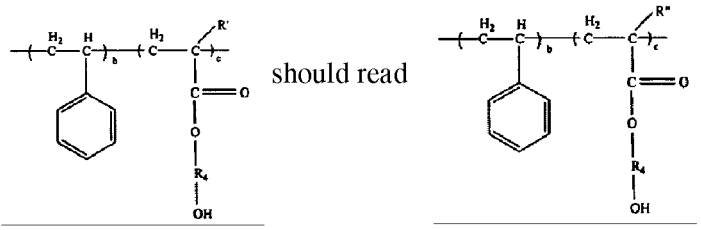 should read 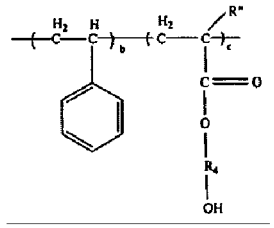

Column 3,  
Formula 14, the formula reading

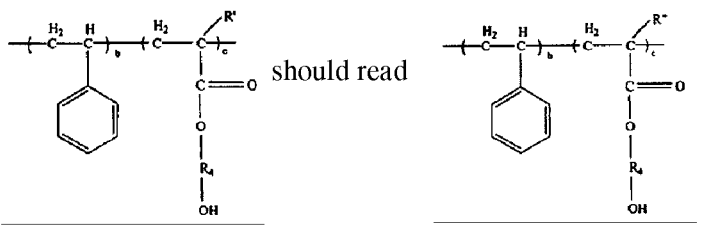 should read 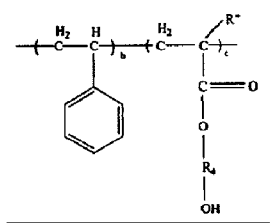

Column 8,  
Formula 14, the formula reading

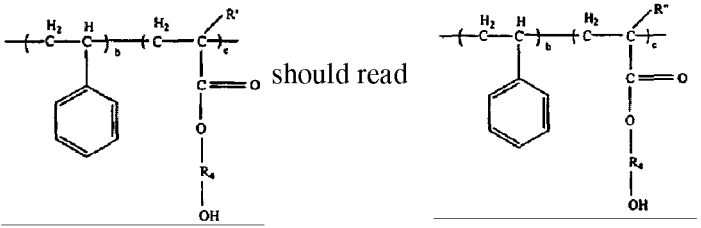 should read 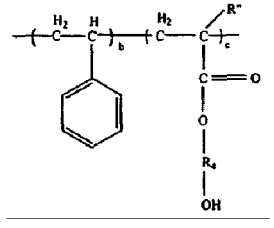

Column 11,  
Formula 14, the formula reading

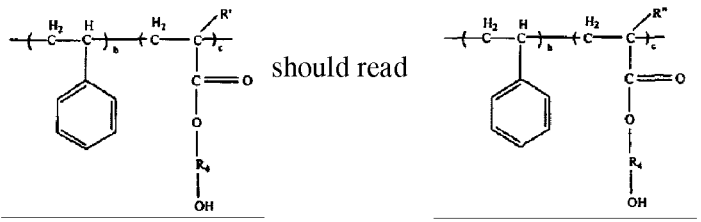 should read 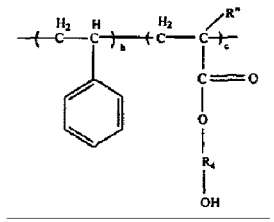

UNITED STATES PATENT AND TRADEMARK OFFICE
CERTIFICATE OF CORRECTION

PATENT NO. : 6,770,720 B2
DATED : August 3, 2004
INVENTOR(S) : Jae-chang Jung et al.

It is certified that error appears in the above-identified patent and that said Letters Patent is hereby corrected as shown below:

Column 12,
Formula 14, the formula reading

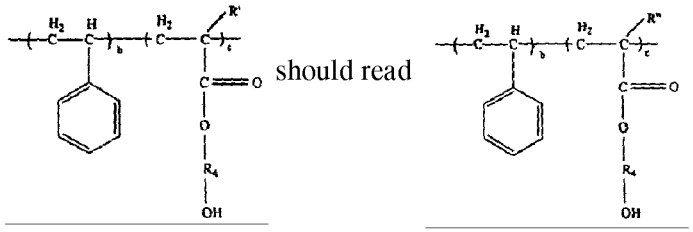 should read

Signed and Sealed this

Twelfth Day of April, 2005

JON W. DUDAS
*Director of the United States Patent and Trademark Office*